United States Patent [19]

Biegelsen

[11] Patent Number: 4,994,867
[45] Date of Patent: Feb. 19, 1991

[54] INTERMEDIATE BUFFER FILMS WITH LOW PLASTIC DEFORMATION THRESHOLD FOR LATTICE MISMATCHED HETEROEPITAXY

[75] Inventor: David K. Biegelsen, Portola Valley, Calif.

[73] Assignee: Xerox Corporation, Stamford, Conn.

[21] Appl. No.: 486,678

[22] Filed: Feb. 28, 1990

Related U.S. Application Data

[62] Division of Ser. No. 223,036, Jul. 22, 1988, Pat. No. 4,935,385.

[51] Int. Cl.$^5$ .......................................... H01L 29/161
[52] U.S. Cl. ..................................... 357/16; 357/61; 357/4; 357/30
[58] Field of Search ................. 357/16, 61, 30 B, 4

[56] References Cited

U.S. PATENT DOCUMENTS

| | | | |
|---|---|---|---|
| 3,993,533 | 11/1976 | Milnes et al. | 156/613 |
| 4,116,751 | 9/1978 | Zaromb | 156/600 |
| 4,392,297 | 7/1983 | Little | 437/132 |
| 4,561,916 | 3/1985 | Akiyama et al. | 148/175 |
| 4,588,451 | 2/1986 | Vernon | 148/175 |
| 4,657,603 | 4/1987 | Kruehler et al. | 437/132 |
| 4,707,216 | 11/1987 | Morkoc et al. | 156/610 |
| 4,774,205 | 9/1988 | Choi et al. | 437/132 |
| 4,786,616 | 11/1988 | Awal et al. | 437/105 |

FOREIGN PATENT DOCUMENTS

| | | | |
|---|---|---|---|
| 62-1225 | 1/1987 | Japan | 437/132 |
| 8600756 | 1/1986 | PCT Int'l Appl. | |

OTHER PUBLICATIONS

Lee et al., "Growth and Characterization of InP Epilayers on ZnSe-Coated Si Substrates by Low Pressure Metalorganic Vapor Phase Epitaxy," *Applied Physics Letters*, vol. 53(2), Jul. 11, 1988, pp. 107–109.

Crumbaker et al., "Growth of InP on Si Substrates by Molecular Beam Epitaxy," *Appl. Phys. Lett.* 54(2), Jan. 9, 1989, pp. 140–142.

Yokoyama et al., "High Quality Zinc Sulfide Epitaxial Layers Grown on (100) Silicon by Molecular Beam Epitaxy," *Appl. Phys. Lett.* 49(7), Aug. 18, 1986, pp. 411–412.

Sullivan et al., "Insulating Epitaxial Films of BaF$_2$, CaF$_2$, and Ba$_x$Ca$_{1-x}$F$_2$ Grown by MBE on InP Substrates," *Journal of Crystal Growth*, vol. 60, No. 2, Dec. 1982, pp. 403–413.

D. A. Neumann et al., "Structural Properties of GaAs on Si and Ge Substrates," *Journal of Vacuum Science and Technology*, vol. 4(2), pp. 642–644, Mar./Apr., 1986.

H. Zogg, "Strain Relief in Epitaxial Fluoride Buffer Layers for Semiconductor Heteroepitaxy," *Applied Physics Letters*, vol. 49(15), pp. 933–935, Oct. 13, 1986.

(List continued on next page.)

Primary Examiner—William Mintel

[57] ABSTRACT

Intermediate buffer films having a low plastic deformation threshold are provided for absorbing defects due to lattice mismatch and/or thermal coefficient of expansion mismatch between a substrate or layer support and an overlayer while concurrently providing a good template for subsequent crystalline growth at the overlayer. This is accomplished for diamond cubic structure substrates, such as, Si or Ge or Si on sapphire or crystalline Si on glass, upon which are to be deposited lattice mismatch overlayers, such as, GaAs or ZnSe. Also, zinc blend type substrates, such as GaAs or InP may be employed with such intermediate buffer films. A characteristic of these intermediate buffer films is a substantially lower plastic deformation threshold compared to either the substrate support or the overlayer to be grown heteroepitaxially thereon. In particular, such high plastic deformable compound materials found suitable for such an intermediate buffer film are cubic III-V, II-VI or I-VII zinc blend compound materials, respectively and specifically, $(Zn_XCd_YHg_{1-X-Y})(S_ASe_BTe_{1-A-B})$ and $Cu(Cl_XBr_YI_{1-X-Y})$ wherein X or Y respectively range between 0 and 1 such that $X+Y \leq 1$ and A and B respectively range between 0 and 1 such that $A+B \leq 1$. Particular examples are GaAs, ZnSe, $ZnS_xSe_{1-x}$, $CdS_xSe_{1-x}$, $HgS_xSe_{1-x}$, CuCl, CuBr or CuI, et al.

5 Claims, 1 Drawing Sheet

OTHER PUBLICATIONS

D. K. Biegelsen, et al., "Initial Stages of Epitaxial Growth of GaAs on (100) Silicon," *Journal of Applied Physics,* vol. 61(5), Mar. 1, 1987.

M. Wittmer et al., "Characterization of Epitaxial (Ca,-Ba)$F_2$ Films on Si(111) Substrates," *Applied Physics Letters,* vol. 49(14), pp. 898–900, Oct. 6, 1986.

H. Zogg et al., "Molecular Beam Epitaxial Growth of High Structural Perfection CdTe on Si Using a (Ca,-Ba)$F_2$ Buffer Layer," *Applied Physics Letters,* vol. 49(22), pp. 1531–1533, Dec. 1, 1986.

N. Chand et al., "Significant Improvement in . . . GaAs on Si(100) by Rapid Thermal Annealing," *Applied Physics Letter,* vol. 49(13), pp. 815–817, Sep. 29, 1986.

G. W. Turner et al., "High-Speed Photoconductive Detectors Fabricated in Heteroepitaxial GaAs Layers," MRS *Symposium Proceedings,* vol. 67, pp. 181–188, 1986.

M. Akiyama et al., "Growth of High Quality GaAs Layers on Si Substrate by MOCVD," *Journal of Crystal Growth,* vol. 77, pp. 490–497, 1986.

R. Fischer et al., "Monolithic Integration of GaAs/AlGaAs . . . Silicon Circuits," *Applied Physics Letters,* vol. 47(9), pp. 983–985, Nov. 1, 1985.

H. Ishiwara et al., "Heteroepitaxy of Si, Ge, and GaAs Films on $CaF_2$/Si Structures," MRS *Symposium Proceedings,* vol. 67, pp. 105–114, 1986.

INTERMEDIATE BUFFER FILMS WITH LOW PLASTIC DEFORMATION THRESHOLD FOR LATTICE MISMATCHED HETEROEPITAXY

This is a division of application Ser. No. 07/223,036, filed 07/22/88 now U.S. Pat. No. 4,935,385.

BACKGROUND OF THE INVENTION

This invention relates to a method of epitaxial growth of a material having one lattice constant and/or thermal coefficient of expansion on a material having another lattice constant and/or thermal coefficient of expansion employing an intermediate or buffer film to provide strain relief and more particularly to the epitaxial growth of cubic III-V, II-VI and I-VII compound semiconductor materials on diamond cubic or zinc blend structure substrate or layer support employing an intermediate buffer film comprising a material with a cubic zinc blend structure having a plastic deformation threshold much less than that of both the substrate support and deposited overlayer.

Lattice mismatch between deposited layers or a deposited material on a substrate and different thermal expansions of various support or substrate materials and deposited overlayers in semiconductor heteroepitaxy provides strains in the deposited material causing stress due to lattice mismatch and thermal expansion mismatch, resulting in induced defect formation, wafer warpage and overlayer cracks. When epitaxial overlayers exceed a critical thickness, misfit and threading dislocations will occur during growth and/or subsequent processing or device operation.

During cooldown after epitaxial growth, some accommodation due to misfit dislocations may occur but at lower or room temperature, only elastic deformation is likely. Thus, strains will occur where different thermal expansions are involved at least in temperature ranges where the overlayers and support do not exhibit plastic deformation capabilities to a sufficient degree. As an example, strains equal to approximately $2.2 \times 10^{-3}$ for 2 μm thick GaAs layers on Si(100) wafers are reported. See D. A. Neumann et al, "Structural Properties of GaAs on Si and Ge substrates", *Journal of Vacuum Science and Technology*, Vol. 4(2), pp. 642–644, March/April 1986. These strains are developed due to the differences of thermal expansion between Si and GaAs and the fixed interface atomic arrangement during cooldown to room temperature after growth and, also, likely due to the lack of plastic deformation of these materials during cooldown and at room temperature.

There is a great deal of work currently directed to growing lattice mismatched materials. One of the most presently popular material combinations under study is the growth of GaAs or other III-V materials on diamond structure substrate supports, such as Si or Ge. In seeking to accommodate lattice mismatch, defects are generated in the subsequently deposited overlayer. These defects, if confined to the interface, are believed to be benign. However, defects which thread into the overlayer material affect the performance and operation of any subsequently formed semiconductor device. Recently, work has been concentrated toward the introduction of an epitaxial buffer film or layer or layers capable of relieving strain without adverse effects in the growth of overlayers. The approach is that strain relief might occur via plastic deformation caused by the movement of dislocations through the buffer film or along its interface with other layers. Further, it is recognized that low elastic stiffness coefficients and low plastic deformation thresholds, of the buffer material could aid to concentrate the strain in the buffer film. In this connection, see, for example, the work of H. Zogg set forth in the article, "Strain Relief in Epitaxial Fluoride Buffer layers For Semiconductor Heteroepitaxy", *Applied Physics Letters*, Vol. 49(15), pp. 933–935, Oct. 13, 1986. In his work, Zogg uses IIa fluorides, such as, $CaF_2$, $SrF_2$ and $BaF_2$ in MBE on supports such as Si, Ge and GaAs to obtain strain relief. In particular, Zogg found in using a $CaF_2$ intermediate film (2% mismatch to Si at the growth temperature of 700° C) improves the quality of the $BaF_2$ overlayer (mismatch 14% relative to Si) and prevents twinning. The process generally employed in the deposition of such buffer films is to deposit at high temperatures (e.g., 700° C) followed by a low temperature growth (e.g., 350° C–450° C) of the overlayer. However, crack-free $CaF_2$ layers thicker than about 20 nm were not possible to obtain using his growth apparatus and procedures.

What is needed is a stable buffer material having better "defect absorbing" properties, i.e., confining misfit dislocations to layer interfaces, but capable of templating the crystalline orientation to the deposited overlayer.

It is an object of this invention to employ an improved intermediate buffer film composed of cubic zinc blend compound structures, which have different deformation properties compared to IIa fluorides, i.e., having low plastic deformation threshold and improved template property compared to IIa fluorides due to the fact that the buffer film shares the same zinc blend structure as the overlayer. Furthermore, such cubic zinc blend materials are more chemically suitable and more compatible, deposition-wise, than IIa fluorides.

SUMMARY OF THE INVENTION

According to this invention, intermediate buffer films having a low plastic deformation threshold are provided for absorbing defects due to lattice mismatch and/or thermal coefficient of expansion mismatch between a substrate or layer support and an overlayer while concurrently providing a good template for subsequent crystalline growth at the overlayer. This is accomplished for diamond cubic structure substrates, such as, Si or GE or Si on sapphire or crystalline Si on glass, upon which are to be deposited lattice mismatched overlayers, such as GaAs, ZnSe or $(Al_X Ga_Y In_Z)(P_A As_B Sb_C)$. Also, zinc blend type substrates, such as GaAs or InP may be employed with such intermediate buffer films. Such III-V substrates are generally lattice mismatched with an overlayer of CdTe, for example. The intermediate buffer film of this invention has a substantially lower plastic deformation threshold compared to either the substrate support or the overlayer to be grown heteroepitaxially thereon. In particular, such highly plastically deformable compound materials found suitable for intermediate buffer films of this invention are the more ionic cubic III-V, II-VI or I-VII sinc blend compound materials, respectively and specifically, $(Zn_X Cd_Y Hg_{1-X-Y})(S_A Se_B Te_{1-A-B})$ and $Cu(Cl_X Br_Y I_{1-X-Y})$ wherein X or Y respectively range between 0 and 1 such that $X+Y \leq 1$ and A and B respectively range between 0 and 1 such that $A+B \leq 1$. Particular examples are ZnSe, $ZnS_X Se_{1-X}$, $CdS_X Se_{1-X}$, $HgS_X Se_{1-X}$, CuCl, CuBr or CuI, et al. Because of the high plastic deformability of the more ionic zinc blend compound materials, these materials are sufficiently soft to retain defects when employed as an intermediate layer yet sufficiently strong bonding to improve heteroepitaxy growth of lattice mismatched materials by propagating a crystalline template.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
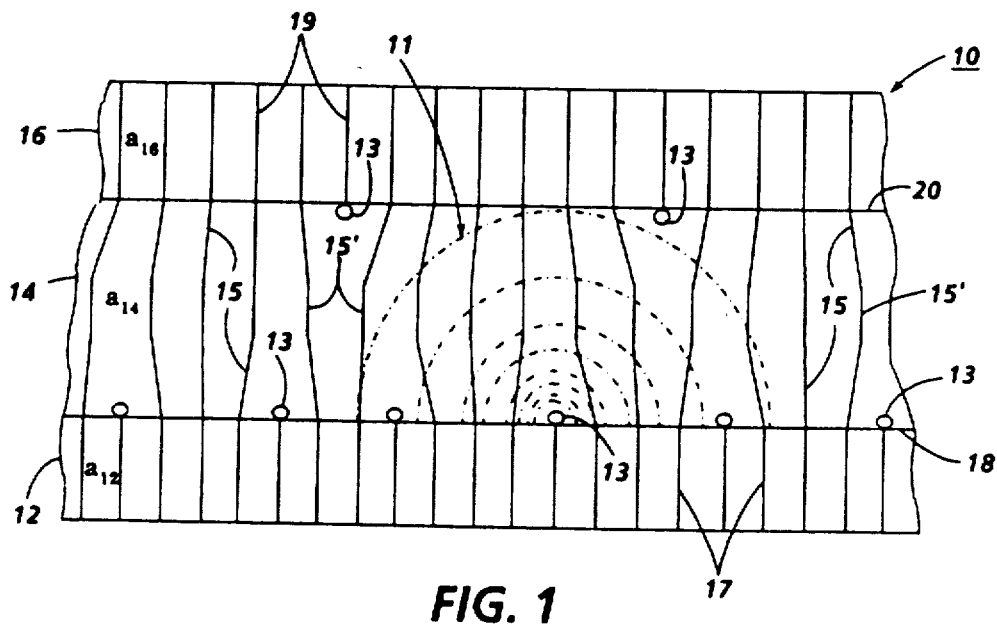
FIG. 1 is a schematic and exaggerated representation of the lattice planes for a GaAs/SnSe/Si structure for the purpose of illustrating the templating characteristics this invention.
Figure 2:
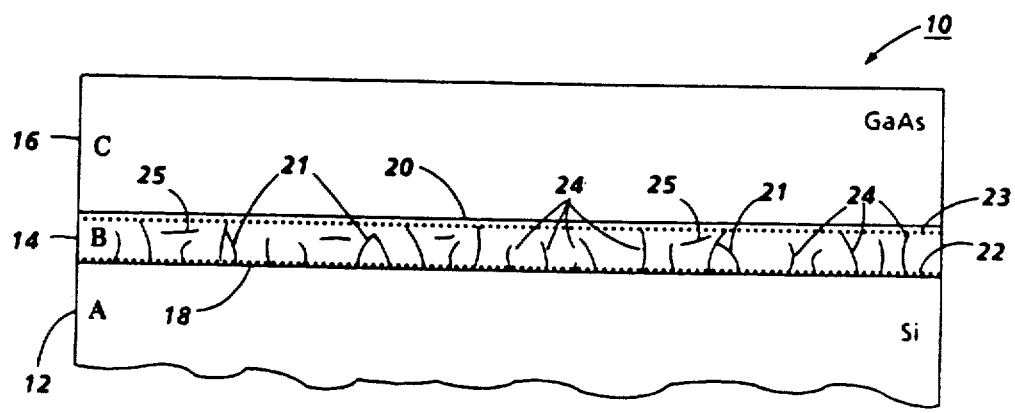
FIG. 2 is a schematic representation of misfit and threading dislocations formed in and at the layer interfaces of the ZnSe buffer film of a GaAs/ZnSe/Si structure.

Reference is now made to FIGS. 1 and 2 for purposes of discussion of the buffer film 14 comprising this invention. Structure 10 comprise a substrate or supporting layer, hereinafter referred to as support 12, upon which is deposited an intermediate buffer film 14 followed by an overlayer 16 to be epitaxially aligned to support 12. Buffer film 14 shown in FIGS. 1 and 2 is for the purpose of lattice matching two compound materials that have different lattice constants while preventing migration of lattice defects into a deposited overlayer. In particular, the material chosen for buffer film 14 possesses low threshold for plastic deformation or low yield strength, compared to underlying support 12 and overlying layer 16. Thermodynamically, the probability of nucleation of dislocations is higher in buffer film 14 than in support 12 or overlayer 16. Furthermore, dislocations tend to be confined to buffer film 14 which, therefore, functions as a "defect absorber", i.e., film 14 being of softer material, accommodates and confines misfit dislocation defects to film bulk while permitting the proper crystal ordering to propagate to overlayer 16 to bring about properly aligned crystal orientation in layer 16. In this manner, buffer film 14 functions as a template for the subsequent epitaxial growth of overlayer 16.

I have discovered that cubic zinc blend compound materials like ZnSe and $ZnS_XSe_{1-X}$ or CuBr have excellent softness qualities and comparatively low plastic deformation threshold for concurrent dislocation suppression and template propagation. Analogous compound materials would also, therefore, likely have these same dual qualities in varying degree.

FIGS. 1 and 2 illustrate one example utilizing buffer film 14 of this invention. In particular, structure 10 comprises a diamond cubic structure semiconductive or insulative support 12, such as, Si or Ge or Si on sapphire or crystalline Si on glass or the like (e.g., SOI), upon which is epitaxially deposited buffer film 14 of this invention comprising an ionic cubic zinc blend compound material, specifically, $(Zn_XCd_YHg_{1-X-Y})(S_ASe_B Te_{1-A-B})$ and $Cu(Cl_XBr_YI_{1-X-Y})$ wherein X or Y respectively range between 0 and 1 such that $X+Y \leq 1$ and A and B respectively range between 0 and 1 such that $A+B \leq 1$. Particular examples are ZnSe, $ZnS_XSe_{1-X}$, $HgS_XSe_{1-X}$, CuCl, CuBr or CuI, et al. Then, an overlayer 16, e.g., GaAs, is epitaxially deposited on buffer film 14. The lattice mismatch of GaAs/Si is approximately equal to 4%.

In FIG. 1, there is an exaggerated illustration of lattice planes 17 for Si substrate 12 and lattice planes 19 for GaAs overlayer 16. The lattice constant of GaAs, $a_{16}$, is 4% larger than that of Si, $a_{12}$. Therefore, if in a length of interface, GaAs contains N lattice planes, then, Si support 12 contains 1.04N lattice planes and there would be at least 0.04N edge dislocations in buffer film 14 resulting in zero dislocations in GaAs overlayer 16. Buffer film 14 is chosen to have a low yield strength to accommodate the stress that occurs in growing GaAs on Si due to lattice misfit as well as thermal stresses set up due to different coefficients of expansion for these two materials upon cooldown after deposition of film 14 and overlayer 16. The induced elastic and plastic deformations are then bound to buffer film 14 because of its softness, but the template of crystal alignment of substrate 12, represented by lattice planes 15, will propagate upwardly to overlayer 16, which will grow in oriented crystal fashion either during the final stages of epitaxial growth of overlayer 16 or during subsequent thermal processing.

Growth of buffer film 14 is a low temperature process accomplished by MBE or by low temperature MOCVD or plasma assisted MOCVD. At low temperature CVD growths, there must be some precracking of molecular gases to succeed in deposition and bonding of atoms on the low temperature surface of support 12. These processes are well known in the art but differ here in the manner of handling of the temperature of growth. If buffer film 14 is attempted to be deposited at high epitaxial temperatures, the atomic constituents of such a thin layer would diffuse rapidly and tend to form thick, widely separated islands. In this connection, see the article of D. K. Biegelsen et al, "Initial Stages of Epitaxial Growth of GaAs on (100) Silicon", *Journal of Applied Physics*, Vol. 61(5), Mar. 1, 1987. The purpose and necessity of low or room temperature deposition is to deposit at a sufficiently low temperature so that deposited atoms are not significantly mobile upon contact with support 12 thereby significantly reducing their tendency at higher temperatures to have sufficient mobility at the depositing surface to form islands. Rather, at such low deposition temperatures, the deposited atoms will have only sufficient energy to bond and register with the underlying lattice, initially forming a uniform continuous film. Low temperature and/or high fluxes are employed in MBE to kinetically capture a thin buffer film 14 with similar growth conditions maintained for initial stages of growth of overlayer 16 until film 14 is uniformly overlayered or encapsulated by the cubic zinc blend compound material.

Once buffer layer 14 has been deposited at or near room temperature, it is preferred that the initial stages of epitaxial deposition of overlayer 16 be conducted at a low temperature. Otherwise, if overlayer 16 were deposited at normally higher temperatures required for good deposition, the underlying buffer layer 14 would coagulate or ball up forming thick islands or even evaporate. Therefore, the initial stage of low temperature deposition of overlayer 16 has the effect to confine the continuous buffer layer 14 and not permit coagulation due to its weaker bonding properties. The low temperature of this initial deposition is dependent upon the chosen compounds for film 14 and overlayer 16, e.g., it may be between room temperature to 300° C depending on the buffer materials and overlayer material being deposited. As indicated previously, overlayer 16 may nucleate as thin discrete oriented islands on buffer film 14 during its initial deposition. If this is the case, then, as deposition continues, these islands coalesce and covalent chemical bonds stitch the islands together. Strain develops in buffer film 14 causing the formation of defects therein, which defects remain in this soft buffer material.

After uniform coating of overlayer 16 on buffer film 14 has been achieved, the growth temperature is cyclically or monotonically increased to better quality growing conditions for crystalline growth of overlayer 16, e.g., 550° C–750° C without fear of decomposition of buffer layer 14 due to its metastable or stable confinement.

Thus, overlayer 16 is stoichiometrically deposited using a substrate temperature and source fluxes such that the surface diffusion length is short. Then, upon increase in growth temperature of overlayer 16, if buffer film 14 is not already crystalline, solid phase recrystallization can nucleate at the surface of support 12 and propagate through and into overlayer 16 with its lattice structure taking on the crystal orientation of the templated lattice structure of support 12, as represented by the templated lattice planes 15 in FIG. 1. If buffer film 14 is deposited in crystalline form, defects will be present in the film but upon growth of overlayer 16, misfit dislocations will be forced to remain in the softer buffer film 14.

An example of the method of this invention is as follows. A substrate 12 of clean silicon, oriented with {100} planes parallel to its surface, although not essential, is introduced into a MBE reactor. After removing surface contaminants, e.g., oxides and carbides, a thin stoichiometric layer of ZnSe or $ZnS_xSe_{1-x}$ approximately 10 nm thick is deposited on the surface of Si substrate 12. ZnSe is deposited in the reactor in the low temperature regime of −60° C to 60° C, such as 20° C, followed by an initial stage of growth of GaAs at about room temperature to about 100° C, which is about 400° C less than its minimal acceptable level for good crystalline growth. After growth of several monolayers of GaAs, the temperature of deposition is gradually increased to its proper deposition temperature of 550° C or more. AS a specific example, the initial growth of GaAs may be at about 100° C. After a uniform overlayer is formed, the temperature of substrate 12 would be monotonically increased, for example, to approximately 580° C. The ramp up would be, for example, 1° C per second increase for a Ga flux of about $10^{16}$ cm$^{-2}$sec$^{-1}$.

For buffer film 14 to suppress and accommodate the mismatch of lattice dislocation densities but properly template through the crystal orientation of support 12, film 14 must be continuous and as thin as possible, e.g., on the order of 10–100 nm. Its thickness can be characterized in the following different ways relating to film stability properties, dislocation temperament and template transmission. Buffer layer 14 must be sufficiently thin so as to remain bound to interface 18 and not break up and diffuse into overlayer 16 during or subsequent to its deposition. If film 14 is too thick, it may, for certain material combinations, become energetically favorable and kinetically possible at higher temperatures to begin to break up and diffuse and function as dopants in adjacent layers, which is not desirable. Said another way, film 14 must be thin enough for stabilizing interfacial free energies to dominate over stabilizing bulk free energies, which energies increase with film thickness. This, of course, depends also on the temperature of deposition of overlayer 16.

The lower limit of the thickness of continuous buffer film 14 is related to the interaction between dislocations 13 at the two interfaces 18 and 20. If the lattice constants $a_{16}$ and $a_{12}$ are both less than lattice constant $a_{14}$, i.e., $a_{14} > a_{12}$ and $a_{16}$, then the misfit strains in the lattice will cause those dislocations to tend to thread away from interfaces 18 and 20 into buffer film 14 and away from support 12 and overlayer 16. A dislocation 13 is set up to reduce misfit strain. As seen in FIG. 1, the lattice planes 15 relax with distance logarithmically until, asymptotically, buffer film 14 achieves its bulk lattice constant $a_{14}$ at 15'. For shorter distances, the buffer lattice is dilated locally. The strain at any particular position at upper interface 20 is the sum of the misfit strain plus the value of the strain fields 11 created by a dislocation 13 (only one such field shown for simplicity) from the closest dislocations 13 at lower interface 18. The strain from dislocations 13 is opposite in sign from the misfit strain. If buffer thickness, t, is less than a value, $t_0$, then the net strain will be reversed in sign due to a dislocation 13 directly below at lower interface 18 and dislocations 13 at upper interface 20 will tend to be bent up into overlayer 16. A good approximation for $t_0[\text{Å}]$ is $$t_0 \approx 1/\text{misfit} = \frac{(a_{14} + a_{16})}{2(a_{14} - a_{16})}$$

For GaAs/ZnSe/Si, $t_0$ is approximately 380Å because the GaAs/ZnSe misfit is 0.0025. For a system with a misfit of 0.01, $t_0$ becomes approximately 100Å. The forgoing approach may be used as a guide. Deviations from $t_0$ will introduce quantitative changes in the density of defects propagating into overlayer 16 which are not confined to buffer film 14.

As previously indicated, the upper limit of the thickness of continuous buffer film 14 is related to (1) unstability of a thicker film at higher processing temperatures with a tendency to start to break up and (2) degradation of template propagation.

FIG. 2 illustrates the functionality of buffer film 14 due to its low plastic deformation. Overlayer 16 must be of a material, e.g., GaAs, having a threshold for plastic deformation that is larger than that of film 14, e.g., ZnSe. Substrate or support layer 12 of Si has a threshold, A, that is very high, i.e., it has relatively little propensity to form dislocations. However, the threshold, B, of film 14 is small. The greater the ratio of thresholds of A/B and C/B, the more completely will dislocations and defects be created and confined to film 14, in particular, confined to interface 20 between film 14 and overlayer 16, as illustrated at 23 in FIG. 2, and at interface 18 between support 12 and film 14, as indicated at 22. Film 14 must be sufficiently thick so as not to cause them to thread up into the growth of overlayer 16 and bring about defect formations in that layer. Thus, as a figure of merit, the larger the threshold ratios A/B and C/B, the greater the results are in achieving a confinement of dislocations 22, 23, 24 and 25 to intermediate film 14 while relieving strain and thermal stress in the structure.

Thus, the compound material for film 14 represents a compromise between material that is sufficiently "soft" to confine dislocation defects but not so "soft" that it will not also function as a template for oriented crystal orientation to propagate from interface 20 into overlayer 16 during subsequent solid phase epitaxy (SPE). The plastic deformation for film 14 must be sufficient to permit its shear stress to be exceeded. Propagation of dislocations and other defects, as represented at 21, 24 and 25 in FIG. 2, are terminated at upper interface 20 because of the absorbing properties of film 14. Both lattice mismatch and thermal stress are, therefore, relieved by the low yield strength of film 14.

In summary, the deposition of buffer film 14 should be stoichiometric so that any tendency for this layer to decompose and diffuse into the deposited GaAs overlayer 16 will be negligible. Moreover, if buffer layer 14 is sufficiently thin, the film will be sufficiently stable in bonding support 12 at interface 18 to prevent its decomposition and diffusion into depositing GaAs overlayer 16. Thus, any undesired diffusion of buffer layer 14 may be prevented because there is a potential well for sufficiently thin films to remain stably bonded between support 12 and layer 16 so that atoms remain bonded with each other.

Also, it is important to recognize that at these low temperatures of deposition for buffer film 14, the deposited film may be more amorphous than crystalline. However, upon ramping up of the deposition temperature during growth of overlayer 16, the increase of temperature will cause solid phase recrystallization of buffer film 14 starting from interface 18 with support 12 acting as the nucleating seed and with the crystallographic structure of Si substrate 12 functioning as a template in the recrystallization process of film 14 as exemplified in FIG. 1.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An intermediate buffer film for lattice matching between a support selected from the group comprising Si, Ge, Si on sapphire, and crystalline Si on glass and an overlayer compound material selected from GaAs, $(Al_X Ga_Y In_Z)(P_A As_B Sb_C)$ and wherein said buffer film is characterized by having a lower plastic deformation threshold than said support and said overlayer and a thickness sufficiently thick to confine misfit dislocations to said buffer film due to lattice mismatch and sufficiently thin to permit lattice permutation of said support lattice structure through said buffer film to function as a lattice template for said overlayer, said buffer film selected from the group consisting of $(Zn_X Cd_Y Hg_{1-X-Y})(S_A Se_B Te_{1-A-B})$ and $Cu(Cl_X Br_Y I_{1-X-Y})$ wherein X and Y respectively range between 0 and 1 such that $X+Y \leq 1$ and A and B respectively range between 0 and 1 such that $A+B \leq 1$.

2. An intermediate buffer film for lattice matching between a support comprising GaAs and an overlayer compound material comprising CdTe and wherein said buffer film is characterized by having a lower plastic deformation threshold than said support and said overlayer and a thickness sufficiently thick to confine misfit dislocations to said buffer film due to lattice mismatch and sufficiently thin to permit lattice permutation of said support lattice structure through said buffer film to function as a lattice template for said overlayer, said buffer film selected from the group consisting of $(Zn_X Cd_Y Hg_{1-X-Y})(S_A Se_B Te_{1-A-B})$ and $Cu(Cl_X Br_Y I_{1-X-Y})$ wherein X and Y respectively range between 0 and 1 such that $X+Y \leq 1$ and A and B respectively range between 0 and 1 such that $A+B \leq 1$.

3. An intermediate buffer film selected from the group consisting of $(Zn_X Cd_Y Hg_{1-X-Y})(S_A Se_B Te_{1-A-B})$ and $Cu(Cl_X Br_Y I_{1-X-Y})$ wherein X and Y respectively range between 0 and 1 such that $X+Y \leq 1$ and A and B respectively range between 0 and 1 such that $A+B \leq 1$ for lattice matching between a lattice mismatched diamond cubic structure support and an overlayer wherein said buffer film is characterized by having a lower plastic deformation threshold than said support and said overlayer and a thickness sufficiently thick to confine misfit dislocations to said buffer film due to lattice mismatch and sufficiently thin to be stable and permit lattice permutation of said support lattice structure through said buffer film to function as a lattice template for said overlayer, said buffer film comprising a cubic zinc blend semiconductor compound.

4. An intermediate buffer film selected from the group consisting of $ZnS_X Se_{1-X}$, $CdS_X Se_{1-X}$, $HgS_X Se_{1-X}$, CuCl, CuBr, and CuI for lattice matching between a lattice mismatched diamond cubic structure support and an overlayer wherein said buffer film is characterized by having a lower plastic deformation threshold than said support and said overlayer and a thickness sufficiently thick to confine misfit dislocations to said buffer film due to lattice mismatch and sufficiently thin to be stable and permit lattice permutation of said support lattice structure through said buffer film to function as a lattice template for said overlayer, said buffer film comprising a cubic zinc blend semiconductor compound.

5. The intermediate buffer film of claim 4 wherein the minimal thickness, $t_0$, of said buffer layer is determined by the approximation of $$t_0 \approx 1/\text{misfit} = \frac{(a_{14} + a_{16})}{2(a_{14} - a_{16})}$$

where $a_{14}$ is the lattice constant for said buffer film and $a_{16}$ is the lattice constant for said overlayer.

* * * * *